United States Patent
Fischer

(10) Patent No.: US 10,600,670 B2
(45) Date of Patent: Mar. 24, 2020

(54) FRAME MOUNTING AFTER FOIL EXPANSION

(71) Applicant: Infineon Technologies AG, Neubiberg (DE)

(72) Inventor: Thomas Fischer, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/860,687

(22) Filed: Jan. 3, 2018

(65) Prior Publication Data

US 2018/0190530 A1    Jul. 5, 2018

(30) Foreign Application Priority Data

Jan. 3, 2017  (DE) .................. 10 2017 100 053

(51) Int. Cl.
| | | |
|---|---|---|
| H01L 21/683 | (2006.01) | |
| H01L 21/78 | (2006.01) | |
| H01L 21/67 | (2006.01) | |
| H01L 21/687 | (2006.01) | |
| B28D 5/00 | (2006.01) | |

(52) U.S. Cl.
CPC ........ *H01L 21/6835* (2013.01); *B28D 5/0052* (2013.01); *H01L 21/67092* (2013.01); *H01L 21/67132* (2013.01); *H01L 21/6836* (2013.01); *H01L 21/68721* (2013.01); *H01L 21/68778* (2013.01); *H01L 21/68785* (2013.01); *H01L 21/78* (2013.01); *H01L 2221/68327* (2013.01)

(58) Field of Classification Search
CPC ..................... B28D 5/0052; H01L 21/67132
See application file for complete search history.

(56) References Cited

U.S. PATENT DOCUMENTS

| | | | |
|---|---|---|---|
| 4,644,639 A | 2/1987 | Atteberry et al. | |
| 5,590,445 A | 1/1997 | Lee | |
| 6,338,982 B1 | 1/2002 | Beroz et al. | |
| 2007/0111484 A1 | 5/2007 | Komura et al. | |
| 2011/0256666 A1* | 10/2011 | Sugo .................. | B28D 5/0011 438/113 |
| 2013/0302969 A1* | 11/2013 | Priewasser ........... | H01L 21/784 438/458 |

FOREIGN PATENT DOCUMENTS

| | | | | |
|---|---|---|---|---|
| DE | 10031983 A1 | 1/2002 | | |
| EP | 1919072 A1 | 5/2008 | | |
| JP | 04252049 A | * 9/1992 | ........ | H01L 21/6836 |
| JP | H04293253 A | 10/1992 | | |
| WO | 2008030960 A2 | 3/2008 | | |

* cited by examiner

*Primary Examiner* — Farun Lu

(57) ABSTRACT

An apparatus which comprises an expansion unit configured for expanding a foil, and a mounting unit configured for subsequently mounting the expanded foil on a frame and a workpiece, in particular a wafer, on the expanded foil.

29 Claims, 2 Drawing Sheets

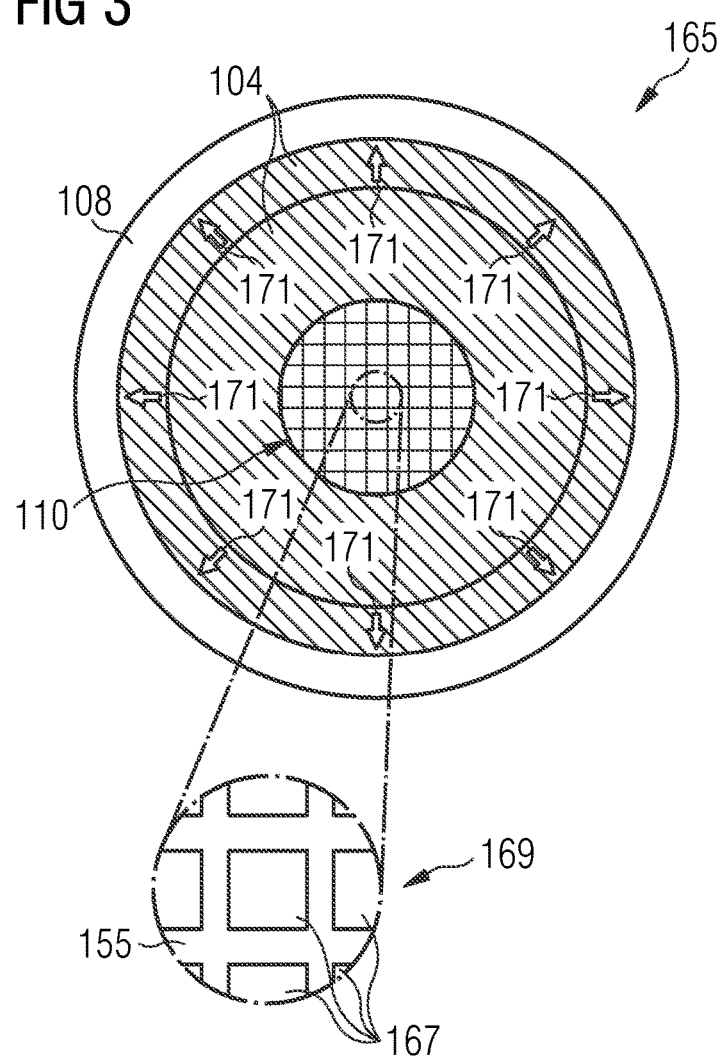
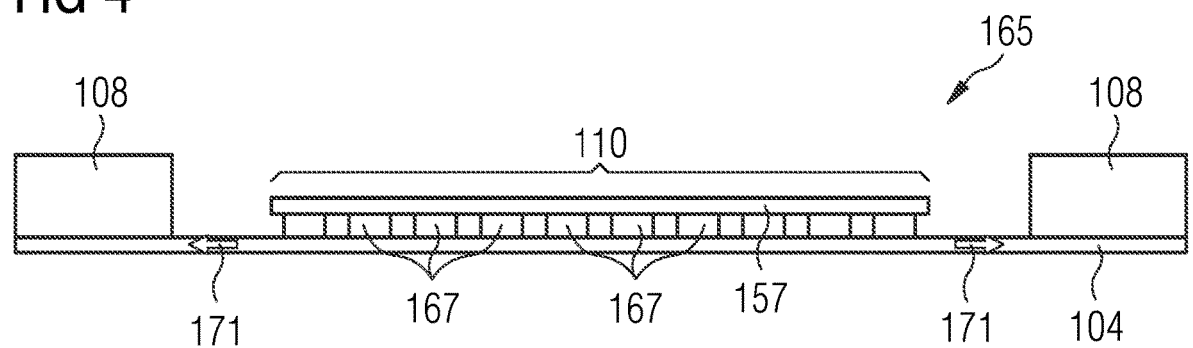

FRAME MOUNTING AFTER FOIL EXPANSION

BACKGROUND OF THE INVENTION

Field of the Invention

The present invention relates to a mounting and expanding apparatus, a corresponding method, and an arrangement.

Description of the Related Art

Packages may be denoted as encapsulated electronic chips with electrical connects extending out of the encapsulant and being mounted to an electronic periphery, for instance on a printed circuit board. Before packaging the electronic chips, a semiconductor wafer is singularized into a plurality of electronic chips. One or more of the electronic chips may then be encapsulated in an encapsulant of the package.

In order to support this process which may also involve a pick and place procedure by which the electronic chips are picked and placed to a desired position for packaging, it may be advantageous to mount a foil on a frame and the wafer (including the electronic chips) on the foil. With such an arrangement, the process of singularizing the wafer into the electronic chips may be simplified. Conventionally, reproducibility of such a process is limited.

SUMMARY OF THE INVENTION

There may be a need for a system for mounting a foil on a frame to enable to mount a workpiece on the foil in a reproducible way.

According to an exemplary embodiment, an apparatus is provided which comprises an expansion unit configured for (in particular radially symmetrically) expanding a foil, and a mounting unit configured for subsequently mounting the expanded foil on a frame and a workpiece (for example a wafer) on the expanded foil.

According to another exemplary embodiment, a method is provided which comprises (in particular radially symmetrically) expanding a foil, and subsequently mounting the expanded foil on a frame and a workpiece (for example a wafer) on the expanded foil.

According to still another exemplary embodiment, an arrangement is provided which comprises a rigid annular frame, an expanded foil fixedly mounted on the frame and being under tensile stress, and an integral workpiece mounted on the expanded foil.

According to an exemplary embodiment, a system of assembling a frame and an expanded foil is provided, wherein expansion or stretching of the foil is accomplished prior to frame mounting so that the tensile force generated by stretching the foil can be permanently conserved for the integral arrangement of foil and frame. The arrangement of foil and frame, in turn, may serve as a reproducible support for a workpiece which can be mounted with high spatial accuracy and with a high degree of position preservation. By taking these measures, it is in particular possible to homogeneously adjust the tension of the foil. A defined foil tension translates into a high reproducibility of the properties of the arrangement. By preventing undesired warpage, wrinkling and other artefacts of a slack foil, exemplary embodiments involving a foil being frame-mounted with tensile force may make it possible to mount even large workpieces (such as semiconductor wafers) in a highly reproducible manner. Hence, the described system allows for a reliable, reproducible and artefact-free provision and definition of foil tension when the foil is mounted on a frame and a workpiece, in particular wafer, is mounted on the expanded foil. Also an undesired tearing of a workpiece carrying foil which may conventionally occur can be suppressed or avoided according to exemplary embodiments due to precisely definable and highly reproducible properties of the arrangement of foil and frame. The provided arrangement in particular enables simple handling even of very large workpieces (for instance wafers larger than 12 inch) and/or very thin workpieces (for instance wafers with electronic chips having a thickness of less than 100 µm, in particular less than 60 µm; however, larger thicknesses are possible as well, for instance between 700 µm and 800 µm). An undesired positional change of the workpiece or part thereof on a foil with undefined properties or having the tendency of wrinkling may be reliably prevented with an arrangement according to an exemplary embodiment. The position of the workpiece or parts thereof may therefore be predicted and maintained precisely.

DESCRIPTION OF FURTHER EXEMPLARY EMBODIMENTS

In the following, further exemplary embodiments of the apparatus, the method, and the arrangement will be explained.

In the context of the present application, the term "radially symmetrically" may particularly denote a symmetry with respect to spatial directions corresponding to different or all radii of a virtual circle around a center and within the plane of the expanded foil. In particular, a radially outwardly directed force may act along the entire circumference of the expanded foil, in particular with a circumferentially identical absolute value of the force.

It should be appreciated that a skilled person is aware of the fact that foils (for instance as a result of their manufacturing process, for example by rolling) may have an intrinsic slightly asymmetric expansion characteristic. Without wishing to be bound to a specific theory, it is presently believed that a reason for the mentioned phenomenon is a slightly different cross-linking of polymers and a slightly different polymer chain length in different foil extension directions, which may be a result of the manufacturing procedure. In particular, they may be expandable along a first direction to a slightly larger extent than along a second direction being different or even perpendicular to the first direction. Thus, the skilled person will understand that a radially symmetric expansion force applied to the foil may result in an exactly identical expansion along all directions (when the intrinsic properties of the foil are strictly homogeneous or symmetric) or may result in a slightly varying expansion along different directions (when the intrinsic properties of the foil are slightly inhomogeneous or slightly asymmetric). However, a radially homogeneous application of an expansion force may nevertheless result in a substantially identical expansion (although not a completely identical expansion) in different radial directions.

In the context of the present application, the term "expansion" may particularly denote an increase of a surface area of the foil as a result of a force exerted towards an exterior edge of the foil. Upon release of such an expansion force, the foil may (in case of an elastic expansion) or may not (in case of a plastic deformation) move back partially or entirely into the original force-free state thereof. However, such a back motion may be limited or completely disabled by fixedly mounting the foil and the frame to one another in the expanded state of the foil.

In the context of the present application, the term "foil" may particularly denote a thin film, sheet or layer of material having at least some elasticity so as to be capable of increasing its surface area upon exerting an outwardly oriented force. For example, such a foil may be a dicing foil used for dicing a wafer mounted on the expanded foil with the expanded foil being, in turn, mounted on the frame. For example, such a foil may be made of a plastic, which may or may not be coated with an electrically conductive coating for instance comprising carbon, and/or which may also comprise another material such as a fluorescence material.

In the context of the present application, the term "tensile stress" may denote stress induced by pulling forces, i.e. a tensile force. Circumferentially or radially symmetric tensile stress" may denote stress induced by pulling forces exerted along a circumference of the foil and being directed radially outwardly. For instance, the tensile stress applied or exerted to the foil prior to its mounting on the frame and conserved thereafter may expand the foil by at least 0.1%, in particular by at least 0.5%, more particularly by at least 4%. More specifically, it is for instance possible to change a dimension of a foil with an entire diameter of 280 mm by 2 mm or by 15 mm as a result of the expansion.

In the context of the present application, the term "integral workpiece" may denote one single integrally formed body. Thus, an integral workpiece does not cover multiple separate elements which are not held together. One example for an integral workpiece is a semiconductor wafer before singularization in its electronic chips. Another example for an integral workpiece is a semiconductor wafer which is already singularized into its individual separate electronic chips, wherein however the electronic chips are integrally held together by a common carrier (in particular having an adhesive surface) on which the electronic chips are fixedly mounted. Such a carrier may for instance be a carrier foil or a carrier plate (for example made of glass or silicon) on which the individual electronic chips may be fixedly attached so that the electronic chips on the carrier form an integral body.

In an embodiment, the mounting unit is configured for mounting a workpiece, in particular a wafer, on the expanded foil after the expanding. Correspondingly, the method may comprise mounting a workpiece, in particular a wafer, on the expanded foil after the expanding. For example, the workpiece can be a ceramic member, a glass member, a sapphire member, a printed circuit board, etc. Preferably, the workpiece is a wafer such as a semiconductor wafer. In the context of the present application, the term "wafer" may particularly denote a semiconductor substrate which may has been processed to form a plurality of integrated circuit elements in an active region of the wafer. For example, a wafer may have a disk shape and may comprise a matrix-like arrangement of electronic chips in rows and columns. It is possible that a wafer has a circular geometry or a polygonal geometry (such as a rectangular, in particular square shaped, geometry or a triangular geometry). For example, the semiconductor wafer may be a silicon wafer, a germanium wafer, a silicon carbide wafer, a group III-group V-semiconductor wafer, etc. The wafer may also be a mold wafer composed of multiple singularized electronic chips in a matrix of a mold compound. The wafer may still be an integral body, i.e. may have still integrally connected electronic chips, or may be already singularized into individual electronic chips when mounted in the foil. In the latter case, the individual electronic chips may be held together by a common carrier (such as a carrier plate or a carrier foil). However, other workpieces may be mounted on the foil as well.

The arrangement composed of foil, frame and workpiece (in particular a wafer) may be used as an auxiliary body, in particular for singularizing the wafer into separate electronic chips. It is however also possible that the arrangement is used as a transport body for transporting or handling the workpiece in a spatially well-defined and reliable way. The wafer on the foil of the arrangement may be composed of a plurality of still integrally connected electronic chips (i.e. in a state before singularization) or may be already separated into individual electronic chips (i.e. in a state after singularization).

In an embodiment, the method comprises elastically expanding the foil, in particular without plastic deformation. This means that, provided that the expanded foil would be removed from the frame, the foil would move back into its original shape and size. By omitting a plastic or irreversible deformation and carrying out an elastic or reversible deformation only, the reproducibility of the arrangement is further improved. Moreover, this also ensures that any weakening of the material of the foil by excessive expansion, which may involve the risk that the foil tears, can be avoided. However, in other embodiments, the foil may also experience plastic deformation by the expansion.

In an embodiment, the method comprises expanding the foil with a predefined tensile force. The defined exertion of the expansion force may therefore always allow to achieve the same expansion results, for different foils and on different apparatuses. This predefined tensile force may be applied uniformly and may be measured, also in SI units. This allows to manufacture arrangements in a highly reproducible way.

In an embodiment, the expansion unit is configured for expanding the foil with a constant tensile force exerted on the foil along all radial directions. In other words, the absolute value of the expansion force acting on the foil along its entire perimeter may be constant and uniform. This allows to adjust a defined foil expansion state along all radial directions.

In an embodiment, the expansion unit comprises a fixing mechanism configured for (in particular radially symmetrically) fixing (in particular clamping) a (for instance circumferential) portion of the foil before expanding the foil. Correspondingly, the method may comprise fixing (in particular radially symmetrically fixing, more particularly clamping) a circumferential portion of the foil before expanding the foil. By such a fixing mechanism, circumferential ends of the foil may be spatially fixed or immobilized prior to the expansion. Such a fixing or clamping mechanism is easy to implement and allows to fix end portions of the foil without the danger of adhering of the foil after applying a subsequent expansion force.

In an embodiment, the expansion unit comprises a moving mechanism configured for expanding the foil by moving a central portion of the foil relatively to the fixed portion. Correspondingly, the method may comprise expanding the foil by relatively moving the fixed portion of the foil relative to a central portion of the foil. Such a moving mechanism may move a central portion of the foil after fixing end portions thereof preferably along a full circumference of the foil. This may ensure that the central portion is uniformly expanded around its entire perimeter. For instance, a mutual motion direction between the moving mechanism and the fixing mechanism may be perpendicular to a plane corresponding to the central portion of the foil or perpendicular to the above-mentioned radial directions. For instance, the central portion of the foil may be arranged within a horizontal plane and a motion mechanism may operate vertically. In an embodiment, the motion mechanism may comprise a chuck.

In an embodiment, the moving mechanism comprises an exterior ring (such as a clamping ring) for fixing the portion and an interior ring (which may define a circumferential sliding edge along which the foil may slide during the expansion motion) with a smaller diameter than the exterior ring for expanding the central portion. The rings may, for example, be circular rings. The exterior ring may have a larger diameter than the interior ring. The rings may be concentric. By taking this measure, a radially uniform expansion force may be exerted to the central portion of the foil.

In an embodiment, the moving mechanism is configured for keeping the exterior ring in place and for moving the interior ring for expanding. By taking this measure, only the interior ring needs to be moved. By keeping the number of movable elements small, the effort of operating the apparatus is also kept moderate.

In another embodiment, the moving mechanism is configured for moving the exterior ring and for keeping the interior ring in place for expanding. In such an alternative embodiment, only the exterior ring needs to be moved, which also keeps the apparatus compact and simple due to the reduction of the movable elements to only one.

In yet another embodiment, the moving mechanism is configured for moving both the exterior ring and the interior ring, in particular in opposite moving directions, for expanding. In such an embodiment, a particularly quick and strong expansion is rendered possible, when the exterior ring (for instance moving in a downward direction) and the interior ring (for instance moving in an upward direction) move in opposite directions during the expansion.

In an embodiment, the mounting unit is configured for mounting the expanded foil on the frame before mounting the workpiece, in particular wafer, on the expanded foil. Correspondingly, the method may comprise mounting the expanded foil on the frame before mounting the workpiece, in particular wafer, on the expanded foil. This embodiment has the advantage that the expansion force which has previously been applied to the foil can be already conserved by a fixed connection of the frame and the expanded foil prior to the mounting of the workpiece, in particular wafer. This yields highly reliable and reproducible results.

In another embodiment, the mounting unit is configured for mounting the expanded foil on the frame after mounting the workpiece, in particular wafer, on the expanded foil. Correspondingly, the method may comprise mounting the expanded foil on the frame after mounting the workpiece, in particular wafer, on the expanded foil. In such an alternative embodiment, it is also possible that the workpiece, in particular wafer, is mounted first on the foil, and foil and frame are assembled later. This opportunity may increase the flexibility of an operator of freely designing the mounting procedures.

In an embodiment, the mounting unit comprises a frame assembly mechanism configured for mounting the expanded foil on the frame by at least one of the group consisting of pressing the foil and the frame together (i.e. by the application of mechanical pressure), rolling the foil onto the frame (i.e. by applying a rolling force), and mounting the foil on the frame by lamination (for instance supported by heat). The method may be configured correspondingly.

In an embodiment, the mounting unit comprises a workpiece mounting mechanism configured for mounting the workpiece on the expanded foil, i.e. when the foil is already in an expanded state. For instance, this may be accomplished by a roller mechanism. Correspondingly, the method may comprise mounting the workpiece, in particular wafer, on the expanded foil by rolling. By such a roller mechanism, the workpiece may be rolled onto the expanded foil in a reliable and reproducible way.

In an embodiment, the mounting unit comprises a vacuum mechanism configured for mounting the workpiece, in particular wafer, on the expanded foil by a vacuum treatment. Correspondingly, the method may comprise mounting the workpiece, in particular wafer, on the expanded foil by a vacuum treatment. In the presence of a vacuum, the workpiece, in particular wafer, can be simply attached to the foil and may adhere there. This is a very simple and reliable process of mounting the workpiece on the foil.

In an embodiment, the method comprises mounting the expanded foil on the frame so as to conserve a temporarily applied radially symmetric expansion force exerted on the foil. In other words, fixedly mounting the expanded foil on the frame may be accomplished in a way that the previously applied expansion force is permanently preserved along the entire circumference of the frame and the expanded foil. This prevents the foil from wrinkling or bending, which may occur conventionally with a slack foil on a frame. When preserving the tensile force in a radially symmetric way, the corresponding arrangement may also be prevented from suffering from other artefacts resulting from a spatially inhomogeneous force distribution over a surface area of the expansion foil.

In an embodiment, it is possible that—at the time of mounting the workpiece on the expanded foil—the workpiece is a single integral body. In particular, the workpiece may be a wafer not yet singularized into a plurality of electronic chips. It is however alternatively also possible that such an integral workpiece is embodied as a wafer being already singularized into a plurality of electronic chips all mounted on a common carrier. Such a common carrier may be an adhesive carrier foil, an adhesive carrier plate or a mold compound in which the individual electronic chips are held (which may also be denoted as a mold wafer).

In an embodiment, the method comprises singularizing the wafer into separate electronic chips while being mounted on the expanded foil mounted on the frame (alternatively, the wafer may already be separated at the point of time of mounting the wafer on the expanded foil). Such a singularization may be accomplished by mechanically sawing the wafer into separate electronic chips, by laser cutting the wafer into separate electronic chips, or by forming grooves in the wafer between adjacent electronic chips so that the electronic chips may be separated by a small mechanical pulling or breaking force. Further alternatively, the separation may also be accomplished by etching. Moreover, a dicing-before-grinding procedure may be implemented.

In particular, the frame may be a sawing frame. When the frame is embodied as a sawing frame, and the foil is embodied as a dicing foil, the mounted workpiece, in particular wafer, may be singularized into individual electronic chips after the mounting procedure. This can be for instance accomplished by sawing the workpiece, in particular wafer into separate semiconductor or electronic chips.

In an embodiment, the method comprises removing, in particular cutting off, at least part of a portion of the foil which remains outside of the frame after fixedly assembling frame and foil. Thereby, any remaining portions of the foil which are not under tensile tension may be removed.

In an embodiment, the workpiece, in particular wafer, has a size of more than 12 inch, in particular of at least 18 inch. As a result of the concept of expanding the foil prior to its mounting with frame and workpiece, in particular wafer, a spatially homogeneous and directionally radially outwardly oriented expansion force is conserved. This makes it possible to mount even workpieces, in particular wafers, with a large size without the risk of wrinkling, bending, or other artefacts of the foil. This allows processing also large wafers in a reliable and precise way. Also handling of very thin workpieces as part of the arrangement may be significantly simplified by the generation and conservation of the expansion force remaining to act on the foil when its assembly with the frame is completed.

In an embodiment of the arrangement, the integral workpiece is mounted on the expanded foil substantially without tensile stress. When the workpiece is mounted on the foil when the latter is already fully expanded and is fixed on the frame, no or only a small tensile stress is exerted on the workpiece. In particular, a workpiece embodied as a wafer is thereby protected against an increase of a chip-to-chip distance on the wafer as a result of an excessive tensile stress acting on the wafer. This protects the integrity of the wafer and keeps the die-to-die distance constant during handling the wafer.

In an embodiment, the electronic chip is a power semiconductor chip. Such a power semiconductor chip may have integrated therein one or multiple integrated circuit elements such as transistors (for instance field effect transistors like metal oxide semiconductor field effect transistors and/or bipolar transistors such as insulated gate bipolar transistors) and/or diodes. Exemplary applications which can be provided by such integrated circuit elements are switching purposes. For example, such another integrated circuit element of a power semiconductor device may be integrated in a half-bridge or a full bridge. Exemplary applications are automotive applications.

The one or more semiconductor chips may comprise at least one of the group consisting of a diode, and a transistor, more particularly an insulated gate bipolar transistor. For instance, the one or more electronic chips may be used as semiconductor chips for power applications for instance in the automotive field. In an embodiment, at least one semiconductor chip may comprise a logic IC or a semiconductor chip for RF power applications. In one embodiment, the semiconductor chip(s) may be used as one or more sensors or actuators in microelectromechanical systems (MEMS), for example as pressure sensors or acceleration sensors.

As substrate or wafer for the semiconductor chips, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

The above and other objects, features and advantages of the present invention will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments of the invention and constitute a part of the specification, illustrate exemplary embodiments of the invention.

In the drawings:

FIG. 3 illustrates a plan view of an arrangement according to an exemplary embodiment.

FIG. 4 illustrates a cross-sectional view of an arrangement according to another exemplary embodiment.

DETAILED DESCRIPTION OF EXEMPLARY EMBODIMENTS

Figure 1:
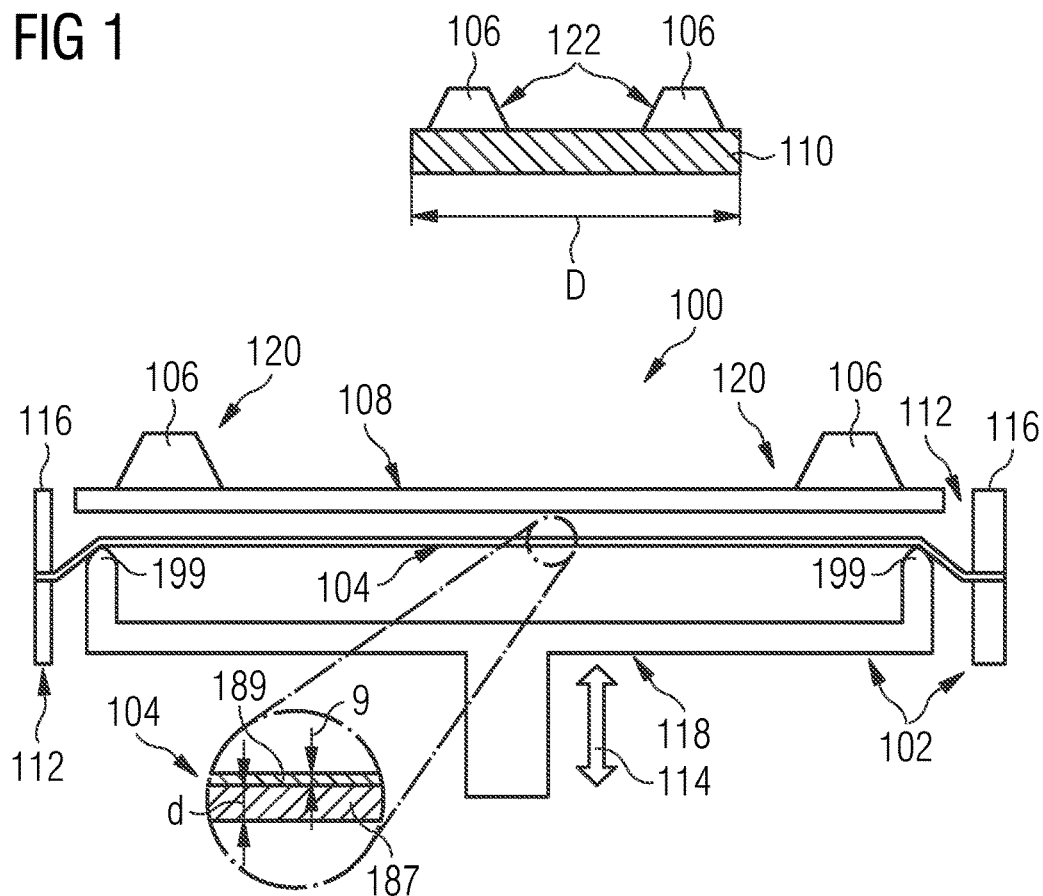
FIG. 1 shows a cross-sectional view of an apparatus for mounting a wafer on an expanded foil and the expanded foil on a frame according to an exemplary embodiment of the invention.

The illustration in the drawing is schematically and not to scale.

Before exemplary embodiments will be described in more detail referring to the figures, some general considerations will be summarized based on which exemplary embodiments have been developed.

According to an exemplary embodiment of the invention, an apparatus and a method for mounting a frame and a workpiece, in particular a wafer, on an already or previously expanded foil is provided which allows to adjust a homogeneous foil tension by symmetrically expanding prior to mounting. This may allow to overcome the conventional shortcoming of inhomogeneous and unpredictable foil properties after mounting of the workpiece, in particular wafer, on the foil held or supported by the frame. By taking the above-described measures, exemplary embodiments of the invention may make it possible to mount even wafers of a remarkable size of larger than 12 inch without visible artefacts, undesired folding of the foil, etc. Therefore, a higher quality, reproducibility and precision may be obtained.

Conventional approaches, such as roller mounters or vacuum mounters, have the disadvantage that the properties of a workpiece and a frame mounted on a foil are not fully reproducible and vary from apparatus to apparatus. Such conventional approaches suffer from poorly comparable and poorly measurable foil properties as well as from different tension conditions in the system foil-frame-workpiece. Adjustment by an operator is only possible in a very limited way lacking user-friendliness. Such conventional concepts are moreover limited to specific and very small wafer sizes. Furthermore, such conventional approaches are cumbersome during operation.

In order to overcome the above and other shortcomings, an exemplary embodiment of the invention provides an apparatus and a method which firstly radially symmetrically fix a foil at the beginning of the assembly procedure. Subsequently, the fixed foil may be expanded by a radially symmetrically force exerting mechanism. In this radially symmetrically expanded state, the expanded foil can be fixedly mounted on a (for instance sawing) frame. Optionally, excessive end portions of the foil may be removed, for instance may be cut away. Thereafter, the workpiece, in particular wafer, can be mounted on the expanded foil, for instance using a roller or a vacuum mechanism. After having fixed the foil on the frame, the previously exerted expansion forced may be released. This however advantageously does not allow the foil to contract or relax again to its initial force free state, since the foil remains circumferentially fixedly mounted on the annular frame so as to conserve the circumferential tensile force keeping the flexible foil in its stiff expanded state.

Exemplary embodiments of the invention have the advantage that the value of the expansion dimension as well as the absolute value of the expansion force can be precisely adjusted and measured, also using SI units (International System of Units). For instance, the expansion dimension may be adjusted to be, for example 1 mm, 2 mm, 3 mm. It is also possible to reproducibly define the expansion force as an applied force in Newton. Due to the preferably radially symmetric geometry of the expansion force exertion, uniform and well-defined push and pull conditions can be adjusted. The described architecture is also perfectly compatible with workpiece dimensions, in particular wafer dimensions, of larger than 12 inch, for instance at least 15 inch or at least 18 inch. Even such large semiconductor wafers can be mounted on the expanded foil immobilized on the frame without optically visible artefacts. The same holds for very thin workpieces (for instance wafers or electronic chips thereof having a thickness of less than 100 µm) which are usually delicate in handling and which are specifically prone to undesired wrinkling or bending, but which may be strongly stabilized by the foil remaining permanently under tension. Lamination of even large and/or very thin wafers on an expanded foil may hence become possible without issues. The arrangement of expanded foil, mounting frame and mounted workpiece (in particular integral wafer, or singularized wafer held together by a common carrier) can be delivered to a backend in a reproducible way.

An exemplary embodiment of the invention therefore implements a procedure of radially symmetrically expanding a foil, mounting the expanded foil on a frame and mounting a workpiece, in particular wafer, on the expanded foil after or prior to the foil fixation on the frame. The latter procedure can be carried out, for example, by roller lamination or vacuum mounting. Therefore, the foil may be expanded radially symmetrically, the resulting pre-tension may be conserved on a frame, and the workpiece (in particular wafer) may be mounted on the expanded and fixed foil subsequently.

Alternatively, it is also possible to expand the foil, then mount the workpiece (in particular wafer) on the expanded foil, and carry out the mounting of the frame only thereafter.

A motion mechanism which may be implemented to carry out or contribute to the above-described procedure can use a movable table. For instance, one embodiment may provide an exterior ring which is movable and fixes the foil. In such an embodiment, an interior ring may be spatially fixed. In another embodiment, an interior ring may be configured to be movable and an exterior ring, which fixes the foil, may be spatially static. In yet another exemplary embodiment, both the exterior ring and the interior ring may be movable (preferably in inverse or opposite directions).

Figure 2:
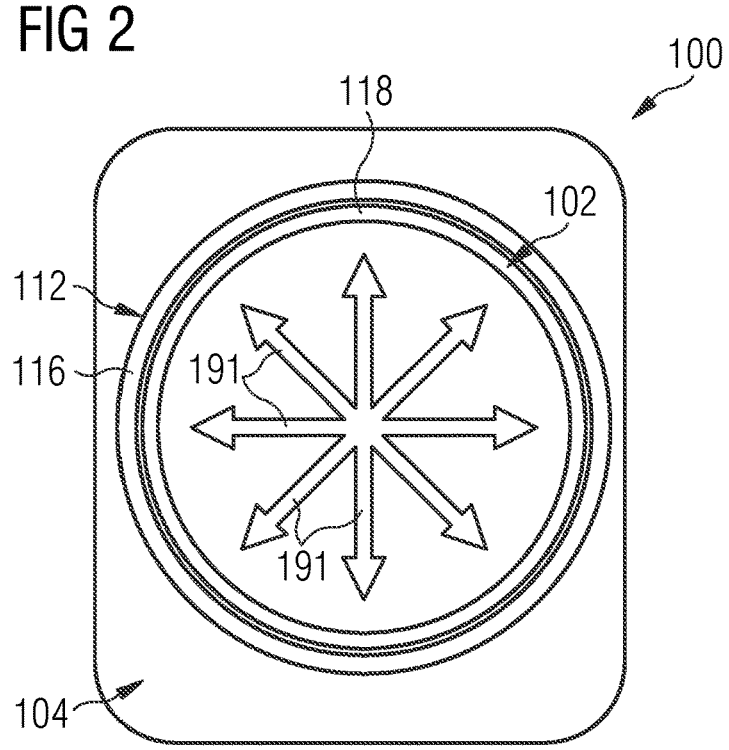
FIG. 2 shows a plan view of part of the apparatus of FIG. 1.

FIG. 1 shows a cross-sectional view of an apparatus 100 according to an exemplary embodiment of the invention for mounting a flat workpiece 110 (here embodied as a processed semiconductor wafer, for instance a silicon wafer, being composed of a plurality of electronic chips arranged in a substantially matrix-like manner) on a flexible and elastic expanded foil 104 (such as a dicing foil) under tension. The expanded foil 104 may be mounted on an annular frame 108 (for instance a sawing frame). The shown workpiece 110 may be disk-shaped and may have a considerable size, for instance may have a diameter, D, of 18 inch. FIG. 2 shows a plan view of the apparatus 100 of FIG. 1.

For example, the foil 104 may be made of a base layer 187 (for instance of a plastic material such as polyolefin or polyvinylchloride, and for instance having a thickness, d, in a range between 50 µm and 300 µm) covered by an adhesive layer 189 (for instance having a thickness, g, in a range between 1 µm and 20 µm). The frame 108 may be of annular shape and may be made of a rigid plastic material or of a rigid metallic material. By the described expansion of the foil 104, it is for instance possible that the foil 104 is expanded by a dimension in a range between 100 µm and 3 mm, for instance 1 mm. For example, the foil 104 may be provided from an endless band (for instance having a length of 100 m) or as a precut foil piece.

The apparatus 100 comprises an expansion unit 102 configured for radially symmetrically expanding the foil 104. The radial directions 191 are oriented perpendicular to the vertical direction of FIG. 1 and are arranged within the paper plane of FIG. 2. Furthermore, the apparatus 100 includes a mounting unit 106 configured for subsequently, i.e. after the expanding of the foil 104, mounting the expanded foil 104 on the frame 108. The mounting unit 106 may also accomplish mounting of the workpiece 110 on the expanded foil 104.

In the shown embodiment, the expansion unit 102 comprises a fixing mechanism 112 (more specifically embodied as a clamping mechanism) configured for radially symmetrically clamping a circumferential portion of the expanded foil 104 before assembling the expanded foil 104 with the frame 108 and the workpiece 110. Moreover, the expansion unit 102 comprises a moving mechanism 114 which is configured for expanding the foil 104 by moving a central portion of the foil 104 relatively to the circumferentially fixed or clamped portion. The moving mechanism 114 comprises an exterior clamping ring 116 for fixing the circumferential portion of the foil 104. The moving mechanism 114 also comprises an interior ring 118 with a smaller diameter than the exterior ring 116 for expanding the central portion of the foil 104. The illustrated moving mechanism 114 is configured for keeping the exterior ring 116 in place (i.e. not moving it) and for moving the interior ring 118 in an upward direction (according to FIG. 1) for expanding the foil 104. When the interior ring 118 moves upwardly while the circumference of the foil 104 remains spatially fixed or clamped in place, the central portion of the foil 104 slides along a sliding edge 199 of the interior ring 118 and is therefore radially symmetrically expanded in an outward direction.

The mounting unit 106 of the apparatus 100 is configured for mounting the expanded foil 104 on the frame 108 before mounting the workpiece 110 on the expanded foil 104. For this purpose, the mounting unit 106 comprises a frame assembly mechanism 120 configured for mounting the expanded foil 104 on the frame 108 by lamination. Furthermore, the mounting unit 106 comprises a workpiece mounting mechanism 122 configured for mounting the workpiece 110 on the expanded foil 104. For example, this can be accomplished by a roller mechanism, a vacuum mechanism, etc.

During the procedure of mounting, the sticky expanded foil 104 is attached to the frame 108, for instance by lowering the frame 108 and/or by continuing the upward motion of the interior ring 118 carrying the central portion of the foil 104 during expansion. Thereby, a radially symmetric expansion force exerted on the foil 104 during the previous procedure of foil expansion is conserved even when the foil 104 is attached to the frame 108. This can be achieved by radially symmetrically clamping the circumferential portion of the foil 104 before mounting the expanded foil 104 on the frame 108. This results in a homogeneous expansion of the foil 104 over its entire surface area within or surrounded by the frame 108.

After expanding the foil 104 and connecting the foil 104 to the frame 108, a portion of the foil 104 outside of the frame 108 may be cut off.

In FIG. 1 and FIG. 2, the foil 104 is a dicing foil. Correspondingly, the frame 108 is a sawing frame. The fixing mechanism 112 clamps the dicing foil 104 during expansion. The movable table shown in FIG. 1 as part of moving mechanism 114 can be vertically moved, i.e. can be moved perpendicular to a plane in which the foil 104 extends, so as to expand the foil 104 while it is clamped by the fixing mechanism 112. FIG. 2 again shows clamping of the dicing foil 104 which overlaps the rings 116, 118.

Referring to FIG. 1 and FIG. 2, the mounting foil 104 is first radially symmetrically fixed by the exterior ring 116 of the fixing mechanism 112. Subsequently, the clamped foil 104 is expanded radially symmetrically by a chuck, see moving mechanism 114. In this state, the expanded foil 104 is mounted on or assembled with the sawing frame 108. An excessive end portion of the foil 104 at the frame 108 (see FIG. 2) can then be removed, for instance by a cutting blade or a knife. Thereafter, the workpiece wafer 110 can be mounted on the expanded foil 104 with the laminated frame 108, for example using a roller or a vacuum chamber.

When the workpiece 110, here embodied as wafer composed of electronic chips, is mounted on the elastically strained foil fixed on the frame 108, the obtained arrangement can be handled in a simple way. Such an arrangement can be easily used for singularizing the wafer into its separate semiconductor chips, for instance by mechanically sawing.

FIG. 3 illustrates a plan view of an arrangement 165 in form of an integral body according to an exemplary embodiment. The shown arrangement 165 comprises annular frame 108 made of a rigid material such as a metal or a plastic. The arrangement 165 furthermore comprises a radially symmetrically and elastically expanded foil 104 fixedly mounted on the frame 108 under radially symmetric expansion tension or tensile stress (which still acts on the foil 108 in the absence of an exterior tensile force due to its fixation with the frame 108). Moreover, the arrangement 165 comprises an integral semiconductor wafer as workpiece 110 which is not yet singularized into its individual semiconductor chips 167 (see detail 169). The individual electronic chips 167 (which may be processed semiconductor sections with one or more integrated circuits formed therein) are integrally held together via interconnecting semiconductor sections 155 (which may be unprocessed semiconductor sections without integrated circuits). Radial arrows 171 show that the foil 104 is immobilized on the rigid frame 108 under homogenous tension in a radially outward direction. According to FIG. 3, the wafer on the foil 104 of the arrangement 165 is an integral body, i.e. is still non-singularized.

FIG. 4 illustrates a cross-sectional view of an arrangement 165 according to another exemplary embodiment. According to FIG. 4, the individual electronic chips 167 which have already been singularized prior to their attachment on the foil 104, are all held together by being mounted on a common carrier 157 (for instance a carrier foil or a carrier plate). Thus, the arrangement of the electronic chips 167 and the carrier 157 together form an integral workpiece 110 which is attached as a whole on the foil 104 after its expansion.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. An apparatus, the apparatus comprising:
   an expansion unit configured for expanding a foil;
   a mounting unit configured for subsequently mounting the expanded foil on a frame and a workpiece on the expanded foil, wherein the expansion unit comprises a fixing mechanism configured for radially symmetrically clamping a portion of the foil before expanding foil,
   wherein the expansion unit, which expands the foil by at least 0.1%, is configured to apply a radially symmetrically tensile stress to the foil prior to its mounting on the frame and conserved thereafter.

2. The apparatus according to claim 1, wherein the expansion unit is configured for expanding the foil with a constant predefined tensile force exerted on the foil along all radial directions.

3. The apparatus according to claim 1, wherein the expansion unit is configured for radially symmetrically expanding the foil.

4. The apparatus according to claim 1, wherein the expansion unit comprises a moving mechanism configured for expanding the foil by moving a central portion of the foil relatively to a fixed portion.

5. The apparatus according to claim 4, wherein the moving mechanism comprises an exterior ring for fixing the portion of the foil and an interior ring with a smaller diameter than the exterior ring for expanding the central portion.

6. The apparatus according to claim 5, comprising one of the following features:
   wherein the moving mechanism is configured for keeping the exterior ring in place and for moving the interior ring for expanding;
   wherein the moving mechanism is configured for moving the exterior ring and for keeping the interior ring in place for expanding;
   wherein the moving mechanism is configured for moving both the exterior ring and the interior ring, in particular along opposite moving directions, for expanding.

7. The arrangement according to claim 1, wherein the integral workpiece is an integral wafer, more particularly one of the group consisting of a wafer not yet singularized into a plurality of electronic chips, and a wafer singularized into a plurality of electronic chips and mounted on a carrier.

8. The apparatus according to claim 1, wherein the foil is a dicing foil under tension.

9. The apparatus according to claim 1, wherein foil is made of a base layer covered by an adhesive layer.

10. The apparatus according to claim 9, wherein base layer is made of one of polyolefin and polyvinylchloride.

11. The apparatus according to claim 9, wherein the base layer has a thickness between 50 µm to 300 µm, and wherein the adhesive layer has a thickness of 1 µm to 20 µm.

12. The apparatus according to claim 1, wherein the foil is expanded by a dimension in a range between 100 µm and 3 mm.

13. The apparatus according to claim 1, wherein the mounting unit comprises a frame assembly mechanism configured for mounting the expanded foil on the frame by lamination.

14. The apparatus according to claim 1, wherein the mounting unit comprises a workpiece mounting mechanism configured for mounting the workpiece on the expanded foil.

15. The apparatus according to claim 10, wherein the workpiece mounting mechanism comprises at least one of a roller mechanism and roller mechanism.

16. A method, the method comprising:
expanding a foil;
subsequently mounting the expanded foil on a frame and a workpiece on the expanded foil, wherein an expansion unit comprises a fixing mechanism configured for radially symmetrically clamping a portion of the foil before expanding foil,
wherein the expansion unit, which expands the foil by at least 0.1%, is configured to apply a radially symmetrically tensile stress to the foil prior to its mounting on the frame and conserved thereafter.

17. The method according to claim 16, wherein the method comprises expanding the foil with a predefined tensile force.

18. The method according to claim 16, wherein the method comprises elastically expanding the foil, in particular without plastic deformation.

19. The method according to claim 16, wherein the method comprises radially symmetrically expanding the foil.

20. The method according to claim 16, comprising one of the following features:
wherein the method comprises mounting the expanded foil on the frame before mounting the workpiece on the expanded foil;
wherein the method comprises mounting the expanded foil on the frame after mounting the workpiece on the expanded foil.

21. The method according to claim 16, wherein the method comprises fixedly mounting the expanded foil on the frame in such a way that an expansion force, in particular a radially symmetric expansion force, exerted on the foil during the expanding is conserved after the fixedly mounting.

22. The method according to claim 16, wherein the method comprises mounting the expanded foil on the frame by at least one of the group consisting of pressing the foil and the frame together, rolling the foil onto the frame, and laminating the foil on the frame.

23. The method according to claim 16, wherein the method comprises singularizing the workpiece configured as wafer into separate electronic chips while remaining mounted on the expanded foil.

24. The method according to claim 16, wherein, at the time of mounting the workpiece on the expanded foil, the workpiece is a single integral body, in particular one of the group consisting of a wafer not yet singularized into a plurality of electronic chips, and a wafer already singularized into a plurality of electronic chips all being mounted on a common carrier.

25. An arrangement, comprising
a rigid annular frame;
an expanded foil fixedly mounted on the frame with tensile stress;
an integral workpiece mounted on the expanded foil, wherein an expansion unit comprises a fixing mechanism configured for radially symmetrically clamping a portion of the foil before expanding foil,
wherein the expansion unit, which expands the foil by at least 0.1%, is configured to apply a radially symmetrically tensile stress to the foil prior to its mounting on the frame and conserved thereafter.

26. The arrangement according to claim 25, wherein the integral workpiece is an integral wafer, more particularly one of the group consisting of a wafer not yet singularized into a plurality of electronic chips, and a wafer singularized into a plurality of electronic chips and mounted on a carrier.

27. The arrangement according to claim 25, wherein the expanded foil is fixedly mounted on the frame with radially symmetric expansion tension.

28. The arrangement according to claim 27, wherein the workpiece, in particular configured as wafer, has a size of more than 12 inch, in particular of at least 18 inch.

29. The arrangement according to claim 25, wherein the integral workpiece is mounted on the expanded foil substantially without tensile stress acting on the integral workpiece.

* * * * *